US012689001B2

(12) United States Patent
Wang et al.

(10) Patent No.: US 12,689,001 B2
(45) Date of Patent: Jul. 21, 2026

(54) PLASMA POTENTIAL ADJUSTMENT CIRCUIT

(71) Applicant: Tokyo Electron Limited, Tokyo (JP)

(72) Inventors: Qiang Wang, Austin, TX (US); Shyam Sridhar, Austin, TX (US); Zhiying Chen, Austin, TX (US); Peter Lowell George Ventzek, Austin, TX (US); Mitsunori Ohata, Taiwa-cho (JP)

(73) Assignee: Tokyo Electron Limited, Tokyo (JP)

( * ) Notice: Subject to any disclaimer, the term of this patent is extended or adjusted under 35 U.S.C. 154(b) by 122 days.

(21) Appl. No.: 18/588,718

(22) Filed: Feb. 27, 2024

(65) Prior Publication Data

US 2025/0273429 A1     Aug. 28, 2025

(51) Int. Cl.
H01J 37/32 (2006.01)

(52) U.S. Cl.
CPC .. H01J 37/32146 (2013.01); H01J 37/32091 (2013.01); H01J 37/321 (2013.01); H01J 37/32935 (2013.01); *H01J 2237/327* (2013.01)

(58) Field of Classification Search
None
See application file for complete search history.

(56) References Cited

U.S. PATENT DOCUMENTS

| | | | |
|---|---|---|---|
| 7,838,430 B2 | 11/2010 | Shannon et al. | |
| 9,589,767 B2 | 3/2017 | Hoffman et al. | |
| 2016/0217975 A1 | 7/2016 | Leypold et al. | |
| 2016/0351404 A1* | 12/2016 | Aramaki | H01J 37/32715 |
| 2017/0358431 A1 | 12/2017 | Dorf et al. | |
| 2019/0350072 A1* | 11/2019 | Dorf | H01J 37/3444 |
| 2021/0351007 A1 | 11/2021 | Carter | |
| 2023/0117812 A1* | 4/2023 | Chen | H01J 37/32174 315/111.21 |
| 2023/0170192 A1* | 6/2023 | Guo | H01J 37/32091 156/345.28 |
| 2023/0386789 A1* | 11/2023 | Schlechte | H01J 37/32926 |

FOREIGN PATENT DOCUMENTS

| | | |
|---|---|---|
| KR | 101115439 B1 | 4/2012 |
| KR | 20190129745 A | 11/2019 |

OTHER PUBLICATIONS

International Search Report and Written Opinion, PCT No. PCT/US2024/051897, Mailed Jan. 23, 2025, Total pp. 11.

\* cited by examiner

*Primary Examiner* — Kenneth B Wells
(74) *Attorney, Agent, or Firm* — Slater Matsil, LLP

(57) ABSTRACT

A method of adjusting sheath potential of a plasma at a substrate includes applying pulsed plasma source power to a plasma electrode in contact with the plasma while applying pulsed bias power to the substrate, measuring electric potential produced by the pulsed plasma source power and the pulsed bias power to obtain time-resolved electric potential information, and adjusting the electric potential profile at the plasma electrode based on the time-resolved electric potential information. Adjusting the electric potential profile adjusts the sheath potential of the plasma at the substrate. The method may be performed using a plasma system including the plasma electrode and a potential adjustment circuit coupled between the plasma electrode and at least one pulsed DC power supply. The potential adjustment circuit may be configured to adjust the electric potential profile at the plasma electrode.

20 Claims, 6 Drawing Sheets

PLASMA POTENTIAL ADJUSTMENT CIRCUIT

TECHNICAL FIELD

The present invention relates generally to plasma systems, and, in particular embodiments, to systems and methods for adjusting sheath potential of a plasma at a substrate using a potential adjustment circuit.

BACKGROUND

Device formation within microelectronic workpieces can involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes. As device structures densify and develop vertically, the desire for precision material processing becomes more compelling.

Plasma processes are frequently used during device formation, such as plasma-driven and plasma-enhanced processes including etching processes, deposition processes, cleaning processes, surface modification processes, and others. Electrical power may be pulsed to various structures to generate plasma and/or to influence plasma species in desirable ways for the furtherance of a given plasma process. For example, source power may be applied to one or more structures in a plasma system to generate a plasma. Bias power is often applied to structures electrically coupled to a substrate in order to direct charges species (such as positive ions) towards a substrate to process the substrate.

When ions are used to process the substrate, it is desirable to deliver the ions to the substrate with certain properties that are favorable for achieving the desired result of the plasma process. For example, the ions may arrive at the substrate with a certain ion energy distribution (IED) and ion angle distribution (IAD), and in a certain quantity (ion flux). Each of these properties may vary both temporally (time-dependence) and spatially (e.g., across different regions of the substrate, such as center versus edge, and so on).

Ion energy is one property of the ions at the substrate surface that is important to plasma processes (e.g., plasma etching processes, such as high-aspect ratio etching processes like high-aspect ratio contact (HARC) etches, etc.). Many conventional methods of applying power to structures in the plasma system result in an ion energy distribution function (IEDF) that includes an undesirably broad ion energy peak. Narrowing of the IED around a target ion energy has various benefits, such as improving process uniformity, repeatability, reliability, yield, and others. Moreover, a narrower IED may enable critical dimensions (CDs) and structures that were previously impractical with broader IED plasma processes.

Therefore, improved systems and methods capable of narrowing the IED of ions at a substrate during a plasma process are desirable.

SUMMARY

In accordance with an embodiment of the invention, a method of adjusting sheath potential of a plasma at a substrate includes applying pulsed plasma source power to a plasma electrode in contact with the plasma while applying pulsed bias power to the substrate, measuring electric potential produced by the pulsed plasma source power and the pulsed bias power to obtain time-resolved electric potential information, and adjusting the electric potential profile at the plasma electrode based on the time-resolved electric potential information. Adjusting the electric potential profile adjusts the sheath potential of the plasma at the substrate.

In accordance with another embodiment of the invention, a plasma system includes a plasma electrode configured to be in contact with a plasma, a substrate holder configured to support a substrate in contact with the plasma, at least one pulsed direct current (DC) power supply configured to deliver pulsed plasma power to the plasma electrode and pulsed bias power to the substrate holder, and a potential adjustment circuit coupled between the plasma electrode and the at least one pulsed DC power supply. The potential adjustment circuit is configured to adjust the electric potential profile at the plasma electrode.

In accordance with still another embodiment of the invention, a plasma system includes a plasma electrode configured to be in contact with a plasma, a substrate holder configured to support a substrate in contact with the plasma, at least one pulsed power supply, a potential adjustment circuit coupled between the plasma electrode and the at least one pulsed power supply, at least one sensor, and a controller operatively coupled to the potential adjustment circuit and the at least one pulsed power supply. The controller includes a processor and a non-transitory computer-readable medium storing a program including instructions that, when executed by the processor, perform a method that includes applying pulsed plasma power to the plasma electrode while applying pulsed bias power to the substrate using the at least one pulsed power supply, measuring electric potential produced by the pulsed plasma power and the pulsed bias power to obtain time-resolved electric potential information using the at least one sensor, and adjusting an electric potential profile at the plasma electrode based on the time-resolved electric potential information using the potential adjustment circuit. Adjusting the electric potential profile adjusts the sheath potential of the plasma at the substrate.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A shows a broad IEDF resulting from an unadjusted plasma potential profile and FIG. 2B shows a narrow IEDF resulting from an adjusted plasma potential profiled in accordance with embodiments of the invention;

Figure 1:
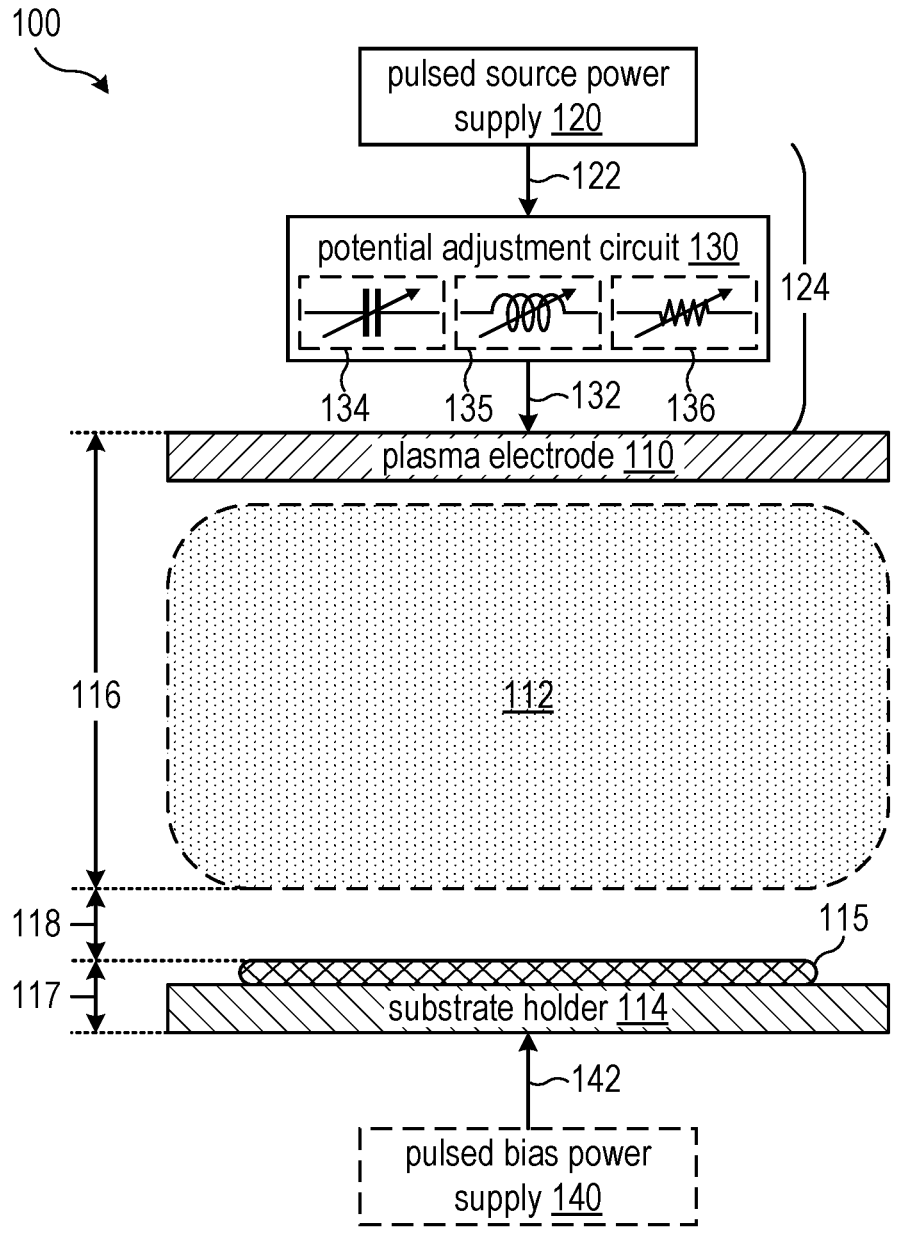
FIG. 1 illustrates an example plasma system including a plasma electrode configured to be in contact with a plasma and a potential adjustment circuit coupled between the plasma electrode and a pulsed power supply in accordance with embodiments of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", "approximately", and "substantially" signify within 10%, and preferably within 5% of the given value or, such as in the case of substantially zero, less than 10% and preferably less than 5% of a comparable quantity.

Controllable ion energy with narrow energy spread (i.e., a narrow IED about a target ion energy) is highly desired to improve various plasma processes, such as those used during device formation. For example, future nodes may require plasma etching processes that have much tighter control and improved capabilities, such as for the formation of 3-dimensional devices. Some plasma etching processes that may benefit from a narrower IED include etching processes for gate formation and high-aspect ratio etching for contacts (e.g., HARC etching processes). Ion energy that is delivered with increased control over the energy and a narrower IED is expected to deliver improved etching performance (e.g., less bowing, less aspect ratio-dependent etching (ARDE), etc.), which may be especially important for high aspect ratio etching.

Many plasma systems deliver pulses of power to the various structures to perform the plasma processes (referred to as pulsed plasma systems herein). Any of the delivered power in the pulsed plasma system may be pulsed, such as the source power, the bias power, and others. One type of pulsed plasma system uses both pulsed source power and pulsed bias power, and the two may be delivered synchronously, antisynchronously, or with arbitrary relative timing. Generating and/or processing a substrate with pulsed power naturally involves transients because the applied power is designed to influence plasma species and the power is being repeatedly switched on and off, sometimes at high pulse frequencies (e.g., in the hundreds of kilohertz, such as about 400 kHz or even higher). Additionally, materials of the substrate (e.g., at the surface) often include dielectrics, which cause the electric potential within the system to be time-dependent during each pulse.

Specifically, in pulsed plasma systems, each negative pulse of the bias power is an ion charging phase where positive charge collects at the surface of the substrate. The collected positive charge due to the surface charging effect causes the electric potential at the substrate to have a positive slope during the ion charging phase. Meanwhile, the plasma potential during the ion charging phase is substantially flat or may have a negative slope. Because the plasma sheath potential (specifically between the plasma and the substrate) is equal to the plasma potential minus the substrate potential, the resulting sheath potential has a positive slope (i.e., is changing over time during the negative pulses of the bias power when ions are being accelerated by the plasma sheath towards the substrate). This broadens the IED of the ions because they experience a changing accelerating voltage throughout the pulse. Further, a deeper slope of the substrate potential is often associated with increased broadening of the IED (such as when the plasma potential during the ion charging phase has a negative slope, when the ion flux is higher so charging occurs faster, etc.).

Conversely, ions accelerated by a constant plasma sheath potential (i.e. a flat slope) have a desirably narrow IED (although some ions are in the plasma sheath at the start and the end of the negative pulses, which causes some disparity in the acceleration time). Therefore, it is desirable to apply power in such a way as to produce a plasma sheath potential with a flat slope during the ion charging phase. However, because of at least the surface charging effects discussed above, merely conventionally applying pulsed power (e.g., including source power and bias power) whether using radio frequency (RF) bias power, DC bias power, dual bias power, etc.) cannot create a constant substrate-plasma plasma sheath potential (regardless of whether the pulsed power is applied to a top electrode, a bottom electrode or both electrodes).

In accordance with various embodiments herein described, the invention proposes systems and methods for modulating the plasma potential to shape (e.g., narrow) the IED of ions at the substrate. In particular, the electric potential of the plasma system may be monitored and the electric potential profile of pulsed power applied to a plasma electrode (i.e., the shape of the power applied to the plasma electrode) may be adjusted accordingly to adjust the sheath potential of the plasma at the substrate. The IED of the ions is determined at least in part by the sheath potential. Therefore, control over the sheath potential mat advantageously facilitate control over the IDE.

In various embodiments, a plasma system includes a plasma electrode configured to be in contact with a plasma, at least one pulsed power supply configured to deliver pulsed plasma power to the plasma electrode and pulsed bias power to a substrate (e.g., one or more pulsed direct current (DC) power supplies, but pulsed alternating current (AC) power supplies may also be used), and a potential adjustment circuit (e.g., including various passive elements such as capacitors, inductors, and resistors) coupled between the plasma electrode and the at least one pulsed power supply. The potential adjustment circuit is configured to adjust an electric potential profile of the pulsed plasma power at the plasma electrode. For example, the pulsed bias power may be delivered to a substrate holder configured to support the substrate so that the substrate is in contact with the plasma.

One or more sensors may also be included and configured to measure electrical potential produced by the pulsed plasma power and the pulsed bias power to obtain time-resolved electric potential information. A controller may be operatively coupled to the one or more sensors and the potential adjustment circuit. The controller may be configured to adjust the electric potential profile of the pulsed plasma power based on the time-resolved electric potential information to adjust the sheath potential of the plasma at the substrate.

Conventional systems and methods used for plasma processes that are seeking to narrow the IED of ions delivered to the substrate being processed primarily focus on applying different (and specially tailored) waveforms to control the substrate potential, and thereby control ion energy to the substrate. However, such tailored waveforms require complicated and expensive modification of current plasma systems. For example, rather than applying a simple waveform (such as a sine wave or a square wave), additional waveform generating circuitry must be included to generate more complicated waveforms for delivery to electrodes in the plasma system. Consequently, while some conventional systems and methods succeed to various extents in narrowing the IED at the substrate, they include different circuits and configurations than the embodiment plasma systems and methods described herein.

The embodiment systems and methods described herein may have various advantages over conventional systems and methods. For example, the embodiment systems and methods may be able to generate target ion energy with a desired narrow IED with minimum hardware updates (such as to existing etching systems, such as HARC etching systems) and a control method that is easily to implement. Another potential advantage of the embodiment systems and methods is the ability to adjust the shape of the plasma potential to match the shape of the substrate potential so that the substrate-plasma sheath voltage has a substantially flat profile (i.e., remains substantially constant). One example of where this may be particularly advantageous is the ion charging phases of a pulsed plasma process. That is, where desirable, the embodiment systems and methods may advantageously result in substantially constant sheath voltage during charging phase(s), providing narrower energy spread of ions traversing the plasma sheath.

Figure 2A:
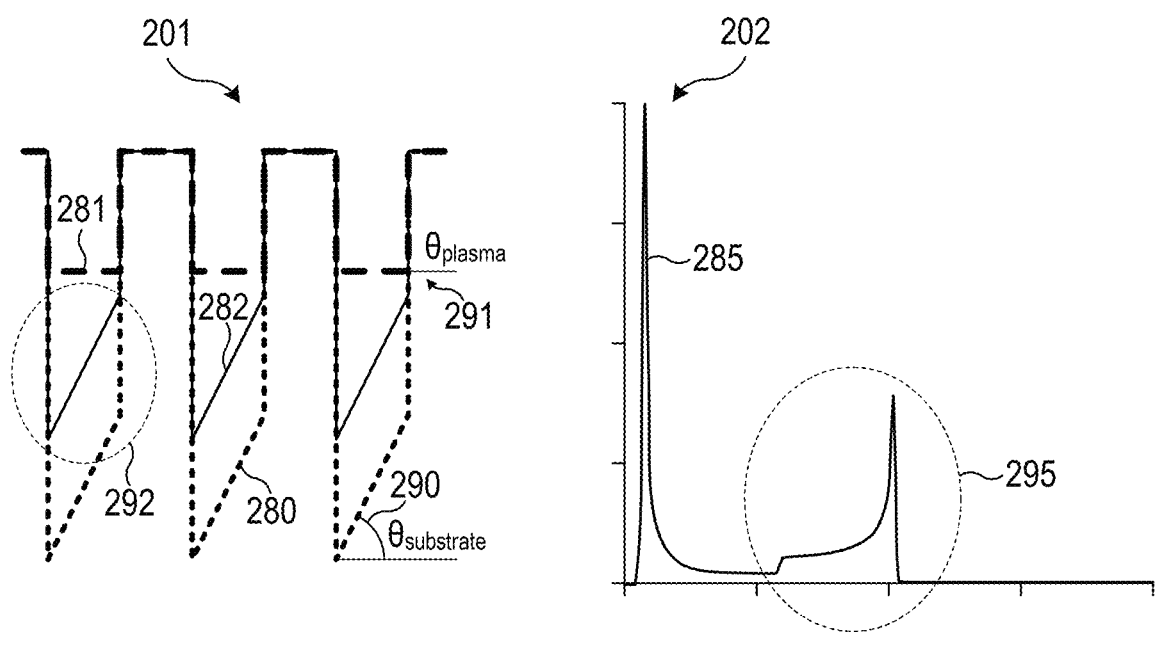
FIGS. 2A and 2B illustrate qualitative graphs of electric potential and IEDF for an example plasma system where
Figure 2B:
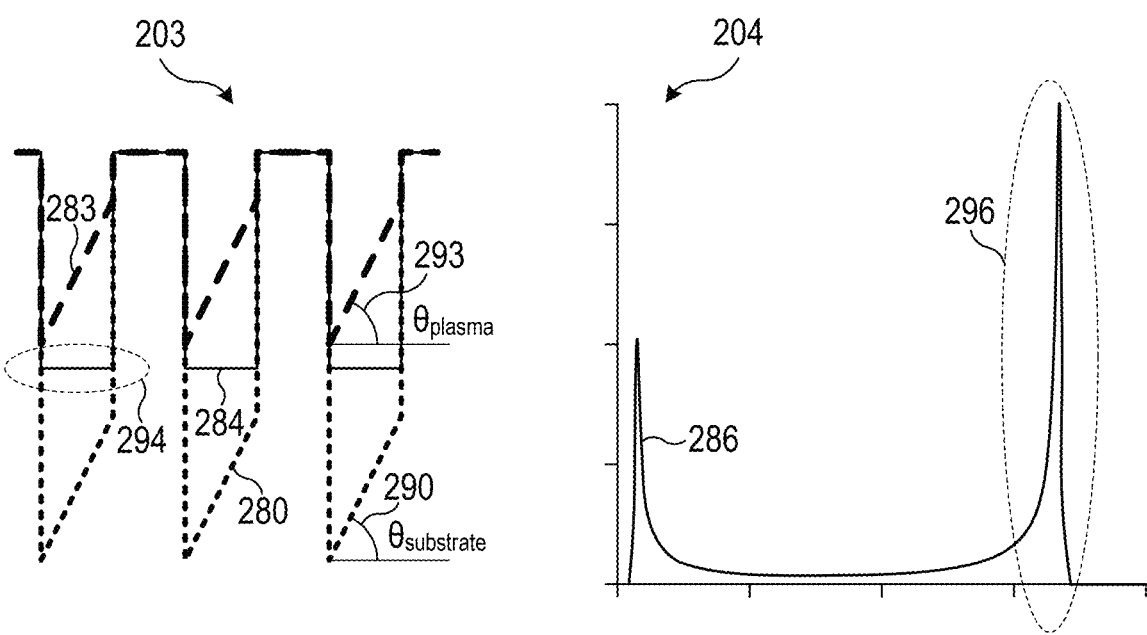

Embodiments provided below describe various plasma systems, and in particular, plasma systems that include a potential adjustment circuit coupled between a pulsed power supply and a plasma electrode. The following description describes the embodiments. FIG. 1 is used to describe an example plasma system. FIGS. 2A and 2B are used to describe several qualitative graphs for an example plasma system. Three more example plasma systems are described using FIGS. 3-5 while an example method of adjusting sheath potential of a plasma at a substrate is described using FIG. 6.

FIG. 1 illustrates an example plasma system including a plasma electrode configured to be in contact with a plasma and a potential adjustment circuit coupled between the plasma electrode and a pulsed power supply in accordance with embodiments of the invention.

Referring to FIG. 1, a plasma system 100 includes a plasma electrode 110 (e.g., a top electrode) coupled to a pulsed plasma source power supply 120. The pulsed plasma source power supply 120 is configured to deliver pulsed power (e.g., DC or RF) to the plasma electrode 110 through a potential adjustment circuit 130 coupled therebetween (i.e. along a transmission path 124 of the pulsed plasma power). The plasma system 100 also includes a substrate holder 114 configured to support a substrate 115. The plasma system 100 is configured to deliver pulsed bias power 142 to the substrate 115 (such as by coupling the pulsed bias power 142 to the substrate holder 114). The pulsed bias power 142 may be delivered using a pulsed bias power supply 140 (as shown), or may be delivered using the pulsed plasma source power supply 120.

The plasma system 100 is configured to generate a plasma 112 between the plasma electrode 110 and the substrate 115 (whether by some combination of the pulsed plasma power and the pulsed bias power 142 or using other applied power). Both the plasma electrode 110 and the substrate 115 are in contact with the plasma 112. The potential adjustment circuit 130 is configured to receive unadjusted pulsed plasma power 122 from the pulsed plasma source power supply 120 and adjust the electric potential profile (i.e. the shape of the voltage) of the pulsed power to generate adjusted pulsed plasma power 132 which is delivered to the plasma electrode 110.

The plasma electrode 110 and the plasma 112 are electrically connected so that the plasma electrode 110 and the plasma 112 may have a certain substantially similar electric potential profile controlled by the pulsed plasma power and schematically represented as plasma potential 116. Similarly, the substrate holder 114 is electrically connected to the substrate 115 and may have a certain substantially similar electric potential profile schematically represented as substrate potential 117 and that is controlled by the pulsed bias power 142, but (as previously discussed) also influenced by other factors such as substrate material properties. A plasma sheath is formed at the interface between the plasma 112 and its boundaries (including the substrate 115), schematically represented as sheath potential 118 and having an electric potential (i.e., sheath voltage) that is substantially equal to the difference between the plasma potential 116 and the substrate potential 117.

The potential adjustment circuit 130 may include various passive elements, such as resistors, inductors, and capacitors. In various embodiments, the potential adjustment circuit 130 is an RLC circuit. The potential adjustment circuit 130 may include one or more of variable capacitance 134, variable inductance 135, and variable resistance 136, such as variable components (i.e., dynamically adjustable, such as electronically adjustable, but may be mechanically adjustable). In various embodiments, the potential adjustment circuit 130 includes one or more variable capacitors, variable inductors, and variable resistors. A variety of combinations are possible. In one specific example, the potential adjustment circuit 130 has variable capacitance, inductance, and resistance (e.g., including at least one of each of a variable capacitor, variable inductor, and a variable resistor). In another specific example, the potential adjustment circuit 130 has variable capacitance, variable resistance, and fixed inductance, (e.g., at least one of each of a variable capacitor and a variable resistor, with one or more fixed inductors).

The electric potential profile of the substrate potential 117 may have a positive slope (i.e., potential vs. time, due to surface charging effects, for example). In contrast, the electric potential profile of the plasma potential 116 may have a substantially flat (or even negative) slope when the potential adjustment circuit 130 does not adjust the unadjusted pulsed plasma power 122 (i.e., if the unadjusted pulsed plasma power 122 is applied to the plasma electrode 110). However, the potential adjustment circuit 130 may advantageously adjust the pulsed plasma power to generate the adjusted pulsed plasma power 132 so that the resulting slope of the plasma potential 116 is positive (e.g., matching the slope of the substrate potential 117 during the ion charging phases). This matched electric profile between the plasma potential 116 and the substrate potential 117 may then produce a substantially flat slope for the sheath potential 118, resulting in a narrower IED.

When included, the variable components of the potential adjustment circuit 130 may be varied within any suitable range of values. One example of a range of values that the variable capacitance 134 may be varied within is about 100 μF to about 1000 μF. An example of a range of values that the variable inductance 135 may be varied within is about 1 μH to about 1000 μH. Similarly, an example of a range of values that the variable resistance 136 may be varied within is about 1Ω to about 1000Ω.

The pulsed power delivered by the plasma system 100 (e.g., using pulsed plasma source power supply 120 and pulsed bias power supply 140) may be pulsed DC power or pulsed AC power, may be delivered in phase or out of phase, and may be pulsed at any desired frequency, such as an RF frequency. For example, the pulse frequency of the pulsed power may be on the order of kilohertz to hundreds of kilohertz (or higher). In various embodiments, the pulse frequency is on the order of hundreds of kilohertz, and is about 400 kHz in one embodiment. In various embodiments, the unadjusted pulsed plasma power 122 and the pulsed bias power 142 are supplied in phase at the same pulse frequency. One or both of the pulsed plasma source power supply 120 and the pulsed bias power supply 140 may include impedance matching networks (e.g., configured to efficiently couple the pulsed power to the corresponding structures of the plasma system 100).

The polarity of the pulses may also vary depending on a given application. In one embodiment, the pulsed bias power 142 is a series of negative DC pulses. However, in some cases, the pulsed bias power 142 may be or include positive DC pulses (such as to mitigate charging, for example). In one embodiment, the unadjusted pulsed plasma power 122 is a series of positive DC pulses. In another embodiment, the unadjusted pulsed plasma power 122 is a series of negative DC pulses. In still another embodiment, the unadjusted pulsed plasma power 122 is a series of alternating positive and negative DC pulses.

FIGS. 2A and 2B illustrate qualitative graphs of electric potential and IEDF for an example plasma system where FIG. 2A shows a broad IEDF for both low energy and high energy ions resulting from an unadjusted plasma potential profile and FIG. 2B shows a narrow IEDF for high energy ions resulting from an adjusted plasma potential profiled in accordance with embodiments of the invention. The qualitative graphs of FIGS. 2A and 2B may be qualitatively representative of any of the example plasma systems described herein such as the plasma system of FIG. 1, for example. Similarly labeled elements may be as previously described.

Referring to FIGS. 2A and 2B, a qualitative potential profile graph 201 shows three time-resolved (time-dependent) voltage measurements for a first case where the pulsed power (here, pulsed DC power) applied to a plasma electrode is unadjusted. In this specific example, synchronized pulsed DC power (e.g., 400 kHz, at a 50% duty cycle) is applied to the bias electrode and the plasma electrode, respectively. During the substrate charging phases, a substrate potential profile 280 has a characteristic positive slope, shown as a substrate potential slope angle 290, whereas an unadjusted plasma potential profile 281 has a flat slope, shown as an unadjusted plasma potential slope angle 291 (which as previously mentioned may also be negative in some cases). The resulting shape of an unadjusted sheath potential profile 282 is a sloped sheath potential 292, which causes a broad IED region 295 for high energy ions, as illustrated in the unadjusted IEDF 285 of qualitative IED graph 202.

A qualitative potential profile graph 203 shows a second case where the pulsed power to the plasma electrode is adjusted. For this example, during the ion charging phases, the substrate potential profile 280 still has the positive slope, but adjusted plasma potential profile 283 has a positive slope (e.g., with an adjusted plasma potential slope angle 293 matching the substrate potential slope angle 290 of the substrate potential profile 280, as shown). Now the resulting shape of adjusted sheath potential profile 284 is a substantially flat sheath potential profile 294, which causes a narrow IED region 296 for high energy ions, as illustrated in the adjusted IEDF 286 of qualitative IED graph 204.

As demonstrated, the slope of the substrate potential profile relative to the slope of the plasma potential profile (which may also be instantaneous in the case of less linear voltage response) may be used as indicators of the flatness of the sheath potential. For this reason, time-resolved measurements of the electric potential at the plasma electrode and the substrate (or substrate holder) may be used to inform the nature of the adjustment of the plasma potential (e.g., using a potential adjustment circuit).

Figure 3:
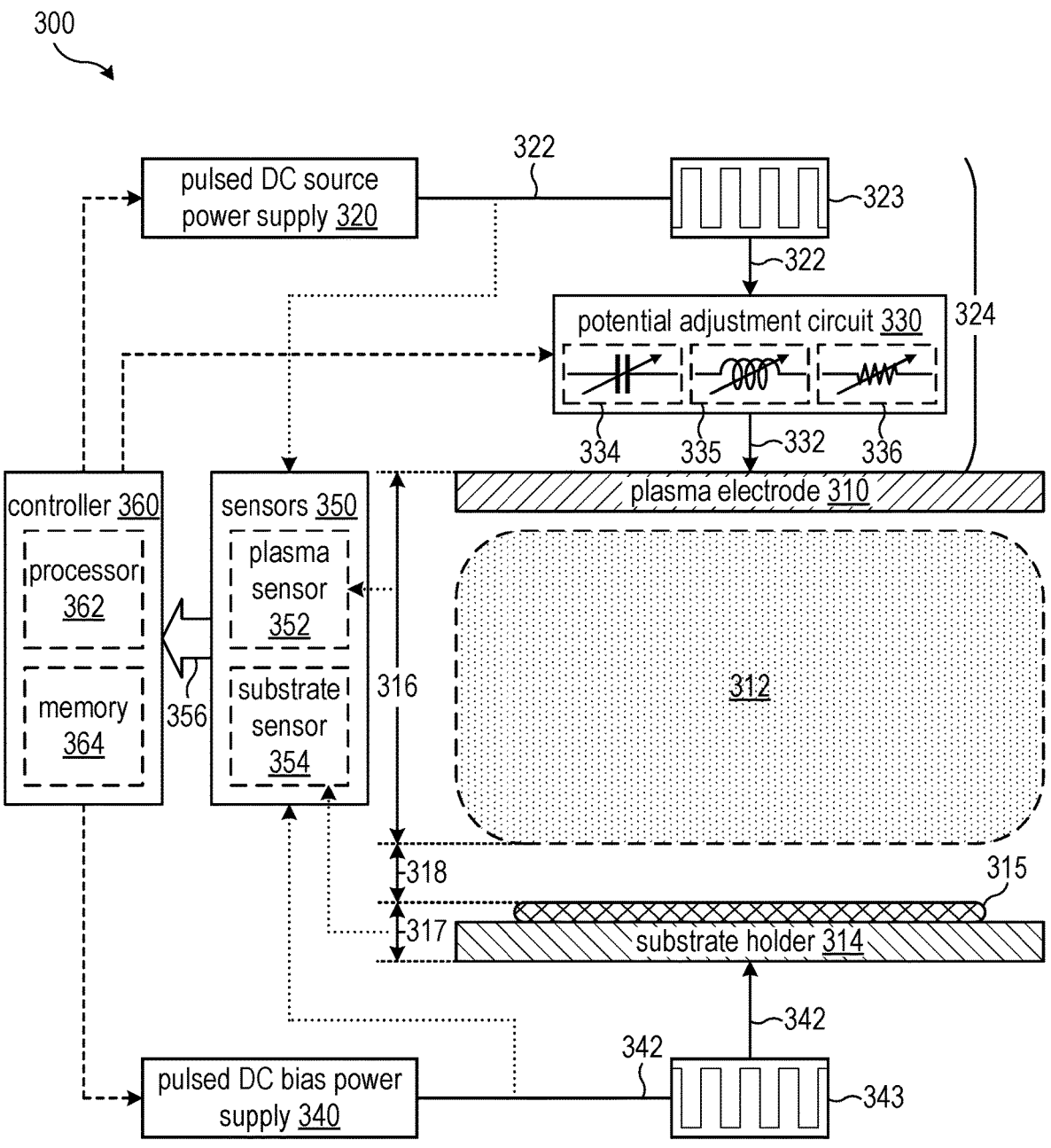
FIG. 3 illustrates an example plasma system including a plasma electrode, a potential adjustment circuit, one or more sensors configured to obtain time-resolved electric potential information received by a controller configured to control the potential adjustment circuit in accordance with embodiments of the invention.

FIG. 3 illustrates an example plasma system including a plasma electrode, a potential adjustment circuit, one or more sensors configured to obtain time-resolved electric potential information received by a controller configured to control the potential adjustment circuit in accordance with embodiments of the invention. The plasma system of FIG. 3 may be a specific implementation of other plasma systems described herein such as the plasma system of FIG. 1, for example. Similarly labeled elements may be as previously described.

Referring to FIG. 3, a plasma system 300 includes a plasma electrode 310 coupled to a pulsed DC source power supply 320 configured to deliver pulsed DC plasma power to the plasma electrode 310 through a potential adjustment circuit 330 coupled along a transmission path 324. It should be noted that here and in the following a convention has been adopted for brevity and clarity wherein elements adhering to the pattern [x30] where 'x' is the figure number may be related implementations of a potential adjustment circuit in various embodiments. For example, the potential adjustment circuit 330 may be similar to the potential adjustment circuit 130 except as otherwise stated. An analogous convention has also been adopted for other elements as made clear by the use of similar terms in conjunction with the aforementioned numbering system.

The plasma system 300 also includes a substrate holder 314 configured to support a substrate 315 and a pulsed DC bias power supply 340 configured to deliver pulsed DC bias power 342 to the substrate 315 by coupling the pulsed DC bias power 342 to the substrate holder 314. The plasma system 300 is configured to generate a plasma 312 between the plasma electrode 310 and the substrate 315 that is in contact with both the plasma electrode 310 and the substrate 315. A controller 360 is configured to control the pulsed DC source power supply 320 to provide an unadjusted pulsed DC plasma power 322 (here, a series of positive DC pulses 323, which are the electric potential profile of the unadjusted pulsed DC plasma power 322 prior to adjustment by the potential adjustment circuit 330) to the potential adjustment circuit 330 and to control the pulsed DC bias power supply 340 to provide pulsed DC bias power 342 (here, a series of negative DC pulses 343) to the substrate holder 314.

One or more sensors 350 are also included and configured to measure the electric potential in the plasma system 300.

For example, a plasma potential sensor 352 (e.g. a high voltage probe) may be included to measure plasma potential 316, a substrate potential sensor 354 (e.g. a high voltage probe or a voltage-current sensor) may be included to measure substrate potential 317 (e.g., at the substrate holder 314), and so on. The sheath potential 318 may be measured indirectly (e.g., but subtracting the substrate potential 317 from the plasma potential 316).

The sensors 350 are configured to obtain time-resolved electric potential information 356, which is then provided to the controller 360. Based on the time-resolved electric potential information 356, the controller 360 is configured to control the potential adjustment circuit 330 (which includes various controllable elements allowing some combination of variable capacitance 334, variable inductance 335, and variable resistance 336) to adjust the pulsed DC plasma power and generate adjusted DC pulsed plasma power 332, which is delivered to the plasma electrode 310 along the transmission path 324.

The sensors 350 may take additional measurements, such as monitoring the electric potential of the unadjusted pulsed DC plasma power 322, the pulsed DC bias power 342, etc. The sensors 350 may also include additional sensors configured to measure other parameters, such as current, plasma density, plasma temperature, ion energy, and others. The sensors 350 may also provide this information to the controller 360. The measurements including the measurements of the plasma potential 316 and the substrate potential 317 may be direct or indirect.

The controller 360 may be implemented as a single controller (as schematically shown) or as a control system including various controllers (such as a dedicated potential adjustment circuit controller, pulse controller, etc.) and processors (whether local and remote). The controller 360 may include a processor 362 and/or a memory 364 (i.e., a non-transitory computer-readable medium) that stores a program including instructions that, when executed by the processor 362, control the potential adjustment circuit 330 (as well as other components of the plasma system 300, such as the pulsed DC source power supply 320 and the pulsed DC bias power supply 340). For example, the memory 364 may have volatile memory (e.g., random access memory (RAM)) and non-volatile memory (e.g., flash memory). Alternatively, the program may be stored in physical memory at a remote location, such as in cloud storage. The processor 362 may be any suitable processor, such as the processor of a microcontroller, a general-purpose processor such as a central processing unit (CPU), a microprocessor, a field-programmable gate array (FPGA), an application-specific integrated circuit (ASIC), and others.

The controller 360 may be further configured to control other parameters associated with performing a desired plasma process using the plasma system 300, such as pulse frequency, duty cycle, pulse amplitude (e.g., peak voltage) for both the unadjusted pulsed DC plasma power 322 and the pulsed DC bias power 342, for example. In one specific example, adjusting the electric profile of the pulsed DC plasma power may alter the peak ion energy (e.g., away from a target ion energy). The controller 360 may then be configured to adjust the pulsed power provided to one or more of the plasma electrode 310 and the substrate holder 314 to adjust the peak ion energy and bring it to the desired target ion energy (e.g., to within a predetermined tolerance, for example).

Figure 4:
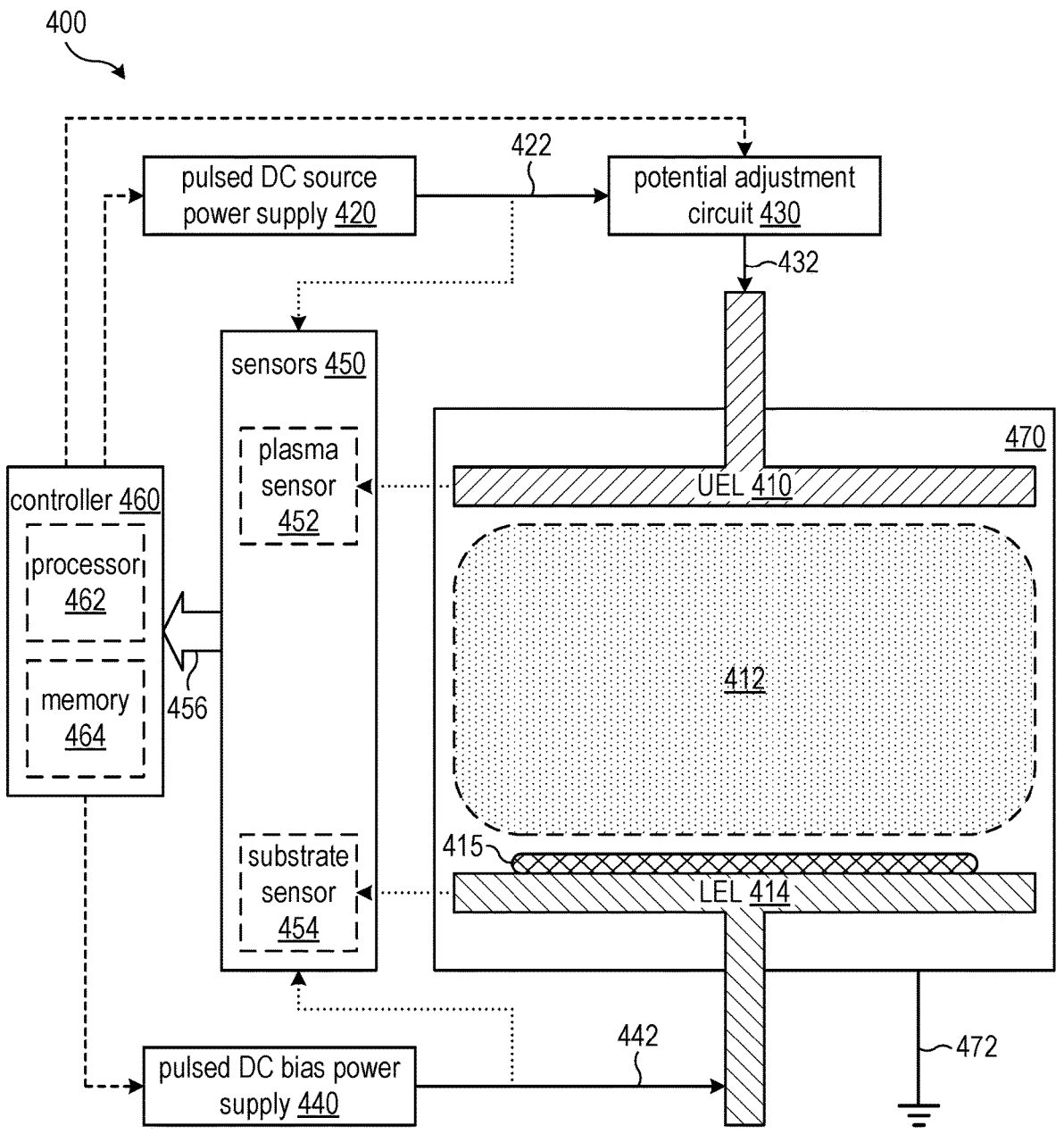
FIG. 4 illustrates an example capacitively coupled plasma (CCP) plasma system that includes a plasma electrode, a potential adjustment circuit, one or more sensors, and a controller in accordance with embodiments of the invention.

FIG. 4 illustrates an example capacitively coupled plasma (CCP) plasma system that includes a plasma electrode, a potential adjustment circuit, one or more sensors, and a controller in accordance with embodiments of the invention. The plasma system of FIG. 4 may be a specific implementation of other plasma systems described herein such as the plasma system of FIG. 3, for example. Similarly labeled elements may be as previously described.

Referring to FIG. 4, a CCP plasma system 400 includes a UEL 410 (an upper electrode that is a specific implementation of a plasma electrode) coupled to a pulsed DC source power supply 420 configured to deliver pulsed DC plasma power to the UEL 410 through a potential adjustment circuit 430. The CCP plasma system 400 also includes an LEL 414 (a lower electrode that is a specific implementation of a substrate holder) configured to support a substrate 415 and a pulsed DC bias power supply 440 configured to deliver pulsed DC bias power 442 to the substrate 415 by coupling the pulsed DC bias power 442 to the LEL 414. The CCP plasma system 400 is configured to generate a plasma 412 between the UEL 410 and the substrate 415 that is in contact with both the UEL 410 and the substrate 415. The plasma 412 is contained by a plasma chamber 470, which may be coupled to a ground potential 472.

A controller 460 (which may include a processer 462 and memory 464) is configured to control the pulsed DC source power supply 420 to provide an unadjusted pulsed DC source power 422 to the potential adjustment circuit 430 and to control the pulsed DC bias power supply 440 to provide pulsed DC bias power 442 to the LEL 414. One or more sensors 450 are also included and configured to measure the electric potential in the CCP plasma system 400, which may include a plasma potential sensor 452 and a substrate potential sensor 454. The sensors 450 are configured to obtain time-resolved electric potential information 456, which is then provided to the controller 460. Based on the time-resolved electric potential information 456, the controller 460 is configured to control the potential adjustment circuit 430 to adjust the pulsed DC source power and generate adjusted pulsed power 432, which is delivered to the UEL 410.

Figure 5:
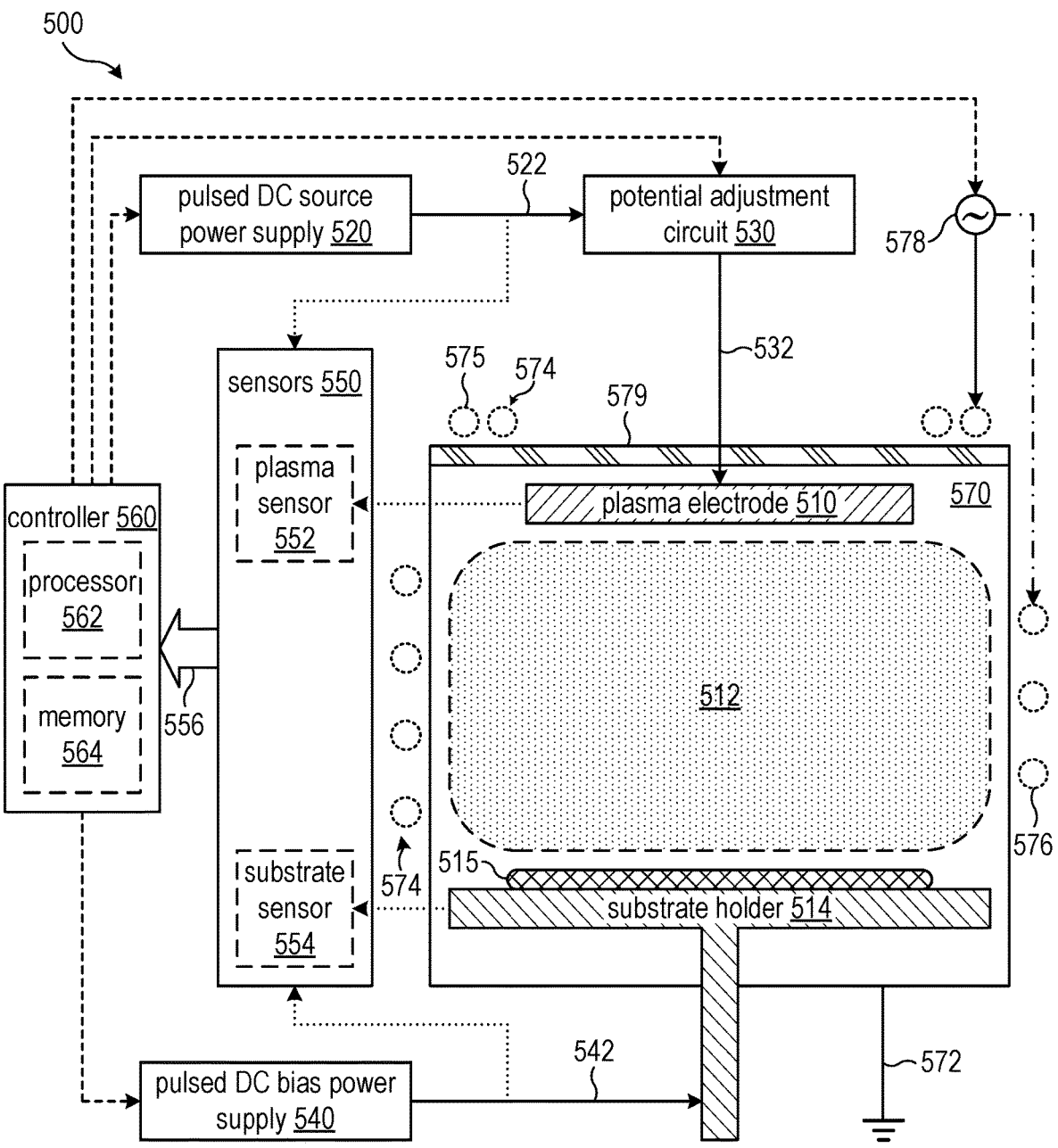
FIG. 5 illustrates an example inductively coupled plasma (ICP) plasma system that includes a source power coupling element, a plasma electrode, a potential adjustment circuit, one or more sensors, and a controller in accordance with embodiments of the invention.

FIG. 5 illustrates an example inductively coupled plasma (ICP) together with a capacitively coupled plasma (CCP) system that includes a source power coupling element, a plasma electrode, a potential adjustment circuit, one or more sensors, and a controller in accordance with embodiments of the invention. The plasma system of FIG. 5 may be a specific implementation of other plasma systems described herein such as the plasma system of FIG. 3, for example. Similarly labeled elements may be as previously described.

Referring to FIG. 5, an ICP/CCP plasma system 500 includes a plasma electrode 510 coupled to a pulsed DC source power supply 520 configured to deliver pulsed DC power to the plasma electrode 510 through a potential adjustment circuit 530. The ICP/CCP plasma system 500 also includes a substrate holder 514 configured to support a substrate 515 and a pulsed DC bias power supply 540 configured to deliver pulsed DC bias power 542 to the substrate 515 by coupling the pulsed DC bias power 542 to the substrate holder 514. The ICP/CCP plasma system 500 is configured to generate a plasma 512 between the plasma electrode 510 and the substrate 515 that is in contact with both the plasma electrode 510 and the substrate 515. The plasma 512 is contained by a plasma chamber 570, which may be coupled to a ground potential 572.

A controller 560 (which may include a processer 562 and memory 564) is configured to control the pulsed DC source power supply 520 to provide an unadjusted pulsed DC power 522 to the potential adjustment circuit 530 and to control the pulsed DC bias power supply 540 to provide pulsed DC bias power 542 to the substrate holder 514. One or more sensors 550 are also included and configured to measure the electric potential in the ICP/CCP plasma system 500, which may include a plasma potential sensor 552 and a substrate potential sensor 554. The sensors 550 are configured to obtain time-resolved electric potential information 556, which is then provided to the controller 560. Based on the time-resolved electric potential information 556, the controller 560 is configured to control the potential adjustment circuit 530 to adjust the pulsed DC power and generate adjusted DC pulsed power 532, which is delivered to the plasma electrode 510.

In contrast to the CCP plasma system 400, the ICP/CCP plasma system 500 is configured to generate the plasma 512 using an alternative mechanism that inductively couples source power (e.g., AC power, such as RF power, from a source power supply 578) to a source power coupling element 574 (e.g., a resonant structure, such as an RF antenna). Various configurations may exist to accomplish this (e.g., along with including a plasma electrode 510). For example, the source power coupling element 574 may be implemented as a planar coil 575 that couples the source power to the plasma 512 through an intervening dielectric material 579 (e.g., a dielectric window). In other embodiments, the source power coupling element 574 may be implemented as a helical coil 576 (which also may be coupled through a dielectric material, such as a dielectric cylinder (not shown).

Figure 6:
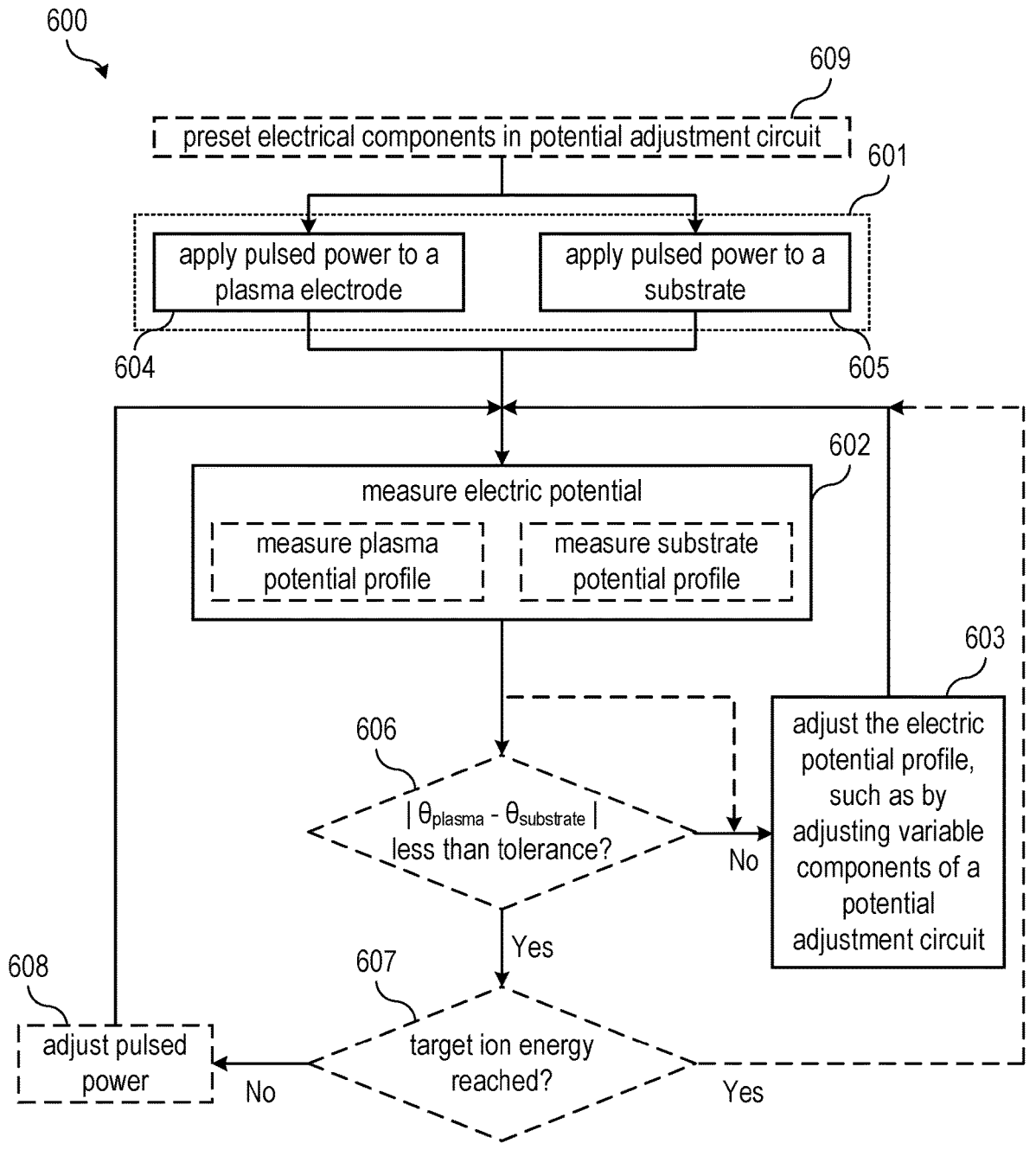
FIG. 6 illustrates an example method of adjusting sheath potential of a plasma at a substrate in accordance with embodiments of the invention.

FIG. 6 illustrates an example method of adjusting sheath potential of a plasma at a substrate in accordance with embodiments of the invention. The method of FIG. 6 may be performed by the example plasma systems described herein, such as the plasma system of FIG. 3, for example. The method of FIG. 6 may be combined with other methods and performed using the systems and apparatuses as described herein. For example, the method of FIG. 6 may be combined with any of the embodiments of FIGS. 1-5. Although shown in a logical order, the arrangement and numbering of the steps of FIG. 6 are not intended to be limited. The method steps of FIG. 6 may be performed in any suitable order or concurrently with one another as may be apparent to a person of skill in the art.

Referring to FIG. 6, a method 600 of adjusting sheath potential of a plasma at a substrate includes a pulsing step 601 of concurrently applying pulsed power to a plasma electrode in a plasma pulsing step 604 while applying pulsed power to the substrate (e.g., bias power) in a substrate pulsing step 605. The plasma may be generated in a plasma chamber of a plasma system, which may be any type of plasma system, such as a CCP plasma system, an ICP plasma system, and others. The plasma electrode is in contact with the plasma and the substrate may be configured to be processed by the plasma (e.g., using various plasma-driven or plasma-enhanced processing techniques, such as etching, deposition, cleaning, modification, etc.). The pulsed source power and the pulsed bias power have the same pulse frequency in various embodiments. In one embodiment, the pulsed power to the plasma electrode and the substrate are in phase, but the pulsed power provided may be delivered out-of-phase in other embodiments.

The applied power to the plasma electrode and the substrate may be independently selected to be pulsed DC (e.g. square waveform) or pulsed AC (e.g., sinusoidal waveform) power. In one embodiment, the pulsed power provided to both the plasma electrode and the substrate is pulsed DC power, but other configurations are possible. The pulsed power may be provided to the plasma electrode and to the substrate by a single power supply or by multiple power supplies. Further, one or more additional power supplies may also be included in the plasma system to supply power to other components. The pulsed bias power is a series of negative DC pulses in one embodiment. The pulsed plasma power may be any combination of positive and negative pulses. In one embodiment, the pulsed plasma power is a series of positive DC pulses. In another embodiment, the pulsed plasma power is a series of negative DC pulses. However, the pulsed plasma power may also alternate between positive and negative pulses in some embodiments.

In a measurement step 602, the electric potential produced by the pulsed power (i.e., the pulsed plasma power and the pulsed bias power) is measured to obtain time-resolved electric potential information (e.g., using one or more sensors included in the plasma system). For example, one or more sensors may be configured to probe the electric potential (i.e., voltage) at various locations in the plasma system, such as at the plasma electrode (with a plasma potential sensor) and the substrate (with a substrate potential sensor), to generate time-dependent potential signal(s) containing the time-resolved electric potential information. That is, as shown in FIG. 6, the plasma potential profile as well as the substrate potential profile may be measured during the measurement step 602. Other measurements (including additional potential measurements as well as measurements of other parameters of interest) may also be made during the measurement step 602 and during other phases of the method 600. In one embodiment, measurements to estimate or determine the ion energy at the substrate are also made during the measurement step 602.

The electric potential profile of the pulsed power provided to the plasma electrode (i.e., shape of the voltage applied at the plasma electrode) is then adjusted in a potential adjustment step 603 (using a potential adjustment circuit coupled between a pulsed plasma power supply and the plasma electrode along a transmission path of the pulsed plasma power, for example). For instance, the pulsed plasma power potential profile may be adjusted based on the time-resolved electric potential information obtained in the measurement step 602. Adjusting the electric potential of the pulsed power provided to the plasma electrode results in an adjustment to the sheath potential of the plasma at the substrate. As already discussed in the foregoing, this may result in a substantially flat sheath potential profile, which may advantageously narrow the IED of ions at the substrate.

The potential adjustment circuit may include various electrical components (such as resistors, inductors, capacitors, and the like) that can be adjusted to adjust transmission properties of the transmission path for the pulsed plasma power. For example, the potential adjustment circuit may be or include an RLC circuit. In one embodiment, adjusting the electrical potential in the potential adjustment step 603 includes adjusting capacitance along the transmission path. In another embodiment, adjusting the electrical potential in the potential adjustment step 603 includes adjusting inductance along the transmission path while in still another embodiment, adjusting the electrical potential in the potential adjustment step 603 includes adjusting resistance along the transmission path. Of course, adjustment of one property is not mutually exclusive and adjustment of multiple properties (e.g., capacitance and resistance) may be leveraged to advantageously perform potential adjustments over a broad range of potential profiles and processing conditions. Some components of the potential adjustment circuit may be fixed. In one embodiment, the potential adjustment circuit includes fixed inductance.

It should also be mentioned that the electrical components of a potential adjustment circuit may be preset as an optional preliminary preset step 609. The preset values may be initial values that serve as a starting point for the potential adjustment in the potential adjustment step 603. In one embodiment, the plasma system may store one or more previously optimized sets of parameters for the electrical components of the potential adjustment circuit, which can be used in the preset step 609 as a more optimal starting point (e.g., requiring little or no adjustment due similarities in substrates or processes).

The potential adjustment step 603 may be performed continuously (e.g., at some predetermined frequency which may or may not be correlated with the frequency of potential measurements). Alternatively, the potential adjustment step 603 may be performed if the difference between the slope angle of the plasma potential and the substrate potential is greater than a predetermined tolerance. For example, the time-resolved electric potential information may include the plasma potential profile and the substrate potential profile. A plasma potential slope ($\theta_{plasma}$) and a substrate potential slope ($\theta_{substrate}$) may then be determined.

In a potential profile check 606, the difference between the plasma potential slope and the substrate potential slope may be determined (e.g., dictating how the electric potential of the pulsed power provided to the plasma electrode should be adjusted). If the magnitude of the difference ($|\theta_{plasma} - \theta_{substrate}|$) is less than the tolerance, then the potential may not be adjusted, while the difference being greater or equal to the tolerance may result in adjustment in the potential adjustment step 603. The difference between the slopes may be minimized (i.e., the difference may be decreased incrementally until no additional benefit is gained by adjusting the electric potential). For example, the predetermined tolerance may represent a boundary value for the difference between the slopes that indicates that the difference is minimized.

Similarly, whether a target ion energy has been reached may be determined in an ion energy check 607. For example, the target ion energy may be any value and may depend on the details of a given application. One example range for the target ion energy is in the range of about 1 eV to about 10 keV, such as about 3 keV. As previously mentioned, the ion energy at the substrate may be measured (indirectly or directly, at some time during the method 600, such as during the measurement step 602, but also potentially at other times). If the measured ion energy is unequal to a target ion energy (e.g., not within a predetermined tolerance of the target ion energy), then the adjustment of the pulsed power provided to one or both of the plasma electrode and the substrate may be performed in a power adjustment step 608. If no adjustment is needed, then the power adjustment step 608 may be omitted.

At this stage, the measurement and adjustment process (e.g., the measurement step 602 and the potential adjustment step 603 as well as the potential profile check 606, the ion energy check 607, and the power adjustment step 608, when included) may be repeated as part of a cycle. For example, this may be used if fluctuations in the slopes of either the plasma potential or the substrate potential are likely to occur during a given process, whether through some aspect of the process itself (such as a change in the rate of charging of the substrate due to etching) or systemic variability in the plasma system. However, in other cases, the slope angles may remain constant or substantially constant throughout a given process and the adjusted settings of the electrical components of the potential adjustment circuit may not need to be adjusted once they are set.

The method 600 may be performed by one or more controllers operatively coupled to a potential adjustment circuit and at least one pulsed power supply. The controller may include a processor and a non-transitory computer-readable medium storing a program including instructions that, when executed by the processor, perform the method 600. Alternatively, the processor may be configured to execute a program from a computer-readable medium that is not included in the controller, whether included in a general-purpose computer operatively connected to the controller, or in a remote location, such as in cloud storage.

Example embodiments of the invention are summarized here. Other embodiments can also be understood from the entirety of the specification as well as the claims filed herein.

Example 1. A method of adjusting sheath potential of a plasma at a substrate, the method including: applying pulsed plasma source power to a plasma electrode in contact with the plasma while applying pulsed bias power to the substrate; measuring electric potential produced by the pulsed plasma source power and the pulsed bias power to obtain time-resolved electric potential information; and adjusting an electric potential profile at the plasma electrode based on the time-resolved electric potential information to adjust the sheath potential of the plasma at the substrate.

Example 2. The method of example 1, where adjusting the electric potential profile at the plasma electrode of the pulsed plasma source power results in a substantially flat sheath potential profile.

Example 3. The method of one of examples 1 and 2, where the time-resolved electric potential information includes a plasma potential profile and a substrate potential profile, and where adjusting the electric potential profile at the plasma electrode includes minimizing the difference between a slope of the plasma potential profile and a slope of the substrate potential profile.

Example 4. The method of one of examples 1 to 3, where the pulsed plasma power and the pulsed bias power are both pulsed direct current (DC) power.

Example 5. The method of example 4, where the pulsed plasma power includes a series of positive DC pulses.

Example 6. The method of one of examples 4 and 5, where the pulsed plasma power and the pulsed bias power have the same pulse frequency and are pulsed in phase with one another.

Example 7. The method of one of examples 1 to 6, where adjusting the electric potential profile includes adjusting capacitance along a transmission path of the pulsed plasma power.

Example 8. The method of one of examples 1 to 7, where adjusting the electric potential profile includes adjusting inductance along a transmission path of the pulsed plasma power.

Example 9. The method of one of examples 1 to 8, where adjusting the electric potential profile includes adjusting resistance along a transmission path of the pulsed plasma power.

Example 10. A plasma system including: a plasma electrode configured to be in contact with a plasma; a substrate holder configured to support a substrate in contact with the plasma; at least one pulsed direct current (DC) power supply configured to deliver pulsed plasma power to the plasma electrode and pulsed bias power to the substrate holder; and a potential adjustment circuit coupled between the plasma electrode and the at least one pulsed DC power supply, the potential adjustment circuit being configured to adjust an electric potential profile at the plasma electrode.

Example 11. The plasma system of example 10, further including: at least one sensor configured to measure electric potential produced by the pulsed plasma power and the pulsed bias power to obtain time-resolved electric potential information, the potential adjustment circuit being configured to adjust the electric potential profile based on the time-resolved electric potential information.

Example 12. The plasma system of example 11, where the time-resolved electric potential information includes a plasma potential profile and a substrate potential profile, where the at least one sensor includes a plasma potential sensor configured to measure the plasma potential profile and a substrate potential sensor configured to measure the substrate potential profile, and where the potential adjustment circuit is further configured to adjust the electric potential profile by minimizing the difference between a slope of the plasma potential profile and a slope of the substrate potential profile.

Example 13. The plasma system of one of examples 10 to 12, where the plasma system is a capacitively coupled plasma (CCP) plasma system, the plasma electrode being an upper electrode of the CCP plasma system.

Example 14. The plasma system of one of examples 10 to 13, further including: a source power coupling element configured to generate the plasma through an intervening dielectric material using applied source power, the plasma system being an inductively coupled plasma (ICP) plasma system.

Example 15. The plasma system of one of examples 10 to 14, where the potential adjustment circuit is an RLC circuit including one or more of variable capacitance, variable inductance, and variable resistance.

Example 16. The plasma system of example 15, where the potential adjustment circuit includes variable capacitance, variable resistance, and fixed inductance.

Example 17. A plasma system including: a plasma electrode configured to be in contact with a plasma; a substrate holder configured to support a substrate in contact with the plasma; at least one pulsed power supply; a potential adjustment circuit coupled between the plasma electrode and the at least one pulsed power supply; at least one sensor; and a controller operatively coupled to the potential adjustment circuit and the at least one pulsed power supply, the controller including a processor and a non-transitory computer-readable medium storing a program including instructions that, when executed by the processor, perform a method including: using the at least one pulsed power supply, applying pulsed plasma power to the plasma electrode while applying pulsed bias power to the substrate; using the at least one sensor, measuring electric potential produced by the pulsed plasma power and the pulsed bias power to obtain time-resolved electric potential information; and using the potential adjustment circuit, adjusting an electric potential profile at the plasma electrode based on the time-resolved electric potential information to adjust a sheath potential of the plasma at the substrate.

Example 18. The plasma system of example 17, where adjusting the electric potential profile at the plasma electrode results in a substantially flat sheath potential profile.

Example 19. The plasma system of one of examples 17 and 18, where the time-resolved electric potential information includes a plasma potential profile and a substrate potential profile, and where adjusting the electric potential profile at the plasma electrode includes minimizing the difference between a slope of the plasma potential profile and a slope of the substrate potential profile.

Example 20. The plasma system of one of examples 17 to 19, where adjusting the electric potential profile includes adjusting one or more of capacitance, inductance, and resistance along a transmission path of the pulsed plasma power.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of adjusting sheath potential of a plasma at a substrate, the method comprising:
    applying pulsed direct current (DC) plasma power to an upper plasma electrode above the substrate and in contact with the plasma using a pulsed DC power supply while applying pulsed DC bias power to the substrate;
    measuring electric potential of the plasma produced by the pulsed DC plasma power and the pulsed DC bias power to obtain time-resolved electric potential information of the plasma; and
    adjusting an electric potential profile at the upper plasma electrode based on the time-resolved electric potential information of the plasma to adjust the sheath potential of the plasma at the substrate by adjusting a voltage shape of the pulsed DC plasma power using a potential adjustment circuit coupled between the pulsed DC power supply and the upper plasma electrode.

2. The method of claim 1, wherein adjusting the electric potential profile at the upper plasma electrode of the pulsed DC plasma power results in a substantially flat sheath potential profile.

3. The method of claim 1,
    wherein the time-resolved electric potential information includes a plasma potential profile and a substrate potential profile, and
    wherein adjusting the electric potential profile at the upper plasma electrode comprises minimizing the difference between a slope of the plasma potential profile and a slope of the substrate potential profile.

4. The method of claim 1, wherein the pulsed DC plasma power comprises a series of positive DC pulses.

5. The method of claim 1, wherein the pulsed DC plasma power and the pulsed DC bias power have the same pulse frequency and are pulsed in phase with one another.

6. The method of claim 1, wherein adjusting the electric potential profile comprises adjusting capacitance along a transmission path of the pulsed DC plasma power.

7. The method of claim 1, wherein adjusting the electric potential profile comprises adjusting inductance along a transmission path of the pulsed DC plasma power.

8. The method of claim 1, wherein adjusting the electric potential profile comprises adjusting resistance along a transmission path of the pulsed DC plasma power.

9. The method of claim 1,
    wherein applying the pulsed DC plasma power comprises generating a substantially square waveform using the pulsed DC power supply, and
    wherein adjusting the voltage shape of the pulsed DC plasma power comprises modifying the substantially square waveform using only passive variable components of the potential adjustment circuit.

10. A plasma system comprising:

an upper plasma electrode configured to be in contact with a plasma;

a substrate holder disposed below the upper plasma electrode and configured to support a substrate in contact with the plasma;

at least one pulsed direct current (DC) power supply configured to deliver pulsed DC plasma power to the upper plasma electrode and pulsed DC bias power to the substrate holder; and a potential adjustment circuit coupled along a transmission path of the pulsed DC plasma power between the upper plasma electrode and the at least one pulsed DC power supply, the potential adjustment circuit being configured to adjust an electric potential profile at the upper plasma electrode by adjusting a voltage shape of the pulsed DC plasma power using only variable passive components of the potential adjustment circuit.

11. The plasma system of claim 10, further comprising:

at least one sensor configured to measure electric potential of the plasma produced by the pulsed DC plasma power and the pulsed DC bias power to obtain time-resolved electric potential information of the plasma, the potential adjustment circuit being configured to adjust the electric potential profile based on the time-resolved electric potential information of the plasma.

12. The plasma system of claim 11, wherein the time-resolved electric potential information of the plasma comprises a plasma potential profile and a substrate potential profile, wherein the at least one sensor comprises a plasma potential sensor configured to measure the plasma potential profile and a substrate potential sensor configured to measure the substrate potential profile, and wherein the potential adjustment circuit is further configured to adjust the electric potential profile by minimizing the difference between a slope of the plasma potential profile and a slope of the substrate potential profile.

13. The plasma system of claim 10, wherein the plasma system is a capacitively coupled plasma (CCP) plasma system, the upper plasma electrode being an upper electrode of the CCP plasma system.

14. The plasma system of claim 10, further comprising:

a source power coupling element configured to generate the plasma through an intervening dielectric material using applied source power, the plasma system being an inductively coupled plasma (ICP) plasma system.

15. The plasma system of claim 10, wherein the potential adjustment circuit is an RLC circuit comprising one or more of variable capacitance, variable inductance, and variable resistance.

16. The plasma system of claim 15, wherein the potential adjustment circuit comprises variable capacitance, variable resistance, and fixed inductance.

17. A plasma system comprising:

an upper plasma electrode configured to be in contact with a plasma;

a substrate holder disposed below the upper plasma electrode and configured to support a substrate in contact with the plasma;

at least one pulsed direct current (DC) power supply;

a potential adjustment circuit coupled between the upper plasma electrode and the at least one pulsed DC power supply;

at least one sensor; and a controller operatively coupled to the potential adjustment circuit and the at least one pulsed DC power supply, the controller comprising a processor and a non-transitory computer-readable medium storing a program including instructions that, when executed by the processor, perform a method comprising:

using the at least one pulsed DC power supply to apply pulsed DC plasma power to the upper plasma electrode and to apply pulsed DC bias power to the substrate;

using the at least one sensor to measure electric potential of the plasma produced by the pulsed DC plasma power and the pulsed DC bias power to obtain time-resolved electric potential information of the plasma; and using the potential adjustment circuit to adjust an electric potential profile at the upper plasma electrode based on the time-resolved electric potential information of the plasma to adjust a sheath potential of the plasma at the substrate by adjusting a voltage shape of the pulsed DC plasma power.

18. The plasma system of claim 17, wherein adjusting the electric potential profile at the upper plasma electrode results in a substantially flat sheath potential profile.

19. The plasma system of claim 17, wherein the time-resolved electric potential information of the plasma includes a plasma potential profile and a substrate potential profile, and wherein adjusting the electric potential profile at the upper plasma electrode comprises minimizing the difference between a slope of the plasma potential profile and a slope of the substrate potential profile.

20. The plasma system of claim 17, wherein adjusting the electric potential profile comprises adjusting one or more of capacitance, inductance, and resistance along a transmission path of the pulsed DC plasma power.

* * * * *